(12) United States Patent
Tobe et al.

(10) Patent No.: US 7,381,291 B2
(45) Date of Patent: Jun. 3, 2008

(54) DUAL-CHAMBER PLASMA PROCESSING APPARATUS

(75) Inventors: Yasuhiro Tobe, Tama (JP); Yoshinori Morisada, Tama (JP); Shingo Ikeda, Tama (JP); Baiei Kawano, Tama (JP)

(73) Assignee: ASM Japan K.K., Tokyo (JP)

(*) Notice: Subject to any disclaimer, the term of this patent is extended or adjusted under 35 U.S.C. 154(b) by 271 days.

(21) Appl. No.: 10/901,825

(22) Filed: Jul. 29, 2004

(65) Prior Publication Data

US 2006/0021701 A1 Feb. 2, 2006

(51) Int. Cl.
C23C 16/00 (2006.01)
C23F 1/00 (2006.01)
H01L 21/306 (2006.01)

(52) U.S. Cl. .............................. 156/345.43; 118/723 E

(58) Field of Classification Search ................ 118/715, 118/722, 723 R, 723 E; 156/345.33, 345.34, 156/345.43, 345.47
See application file for complete search history.

(56) References Cited

U.S. PATENT DOCUMENTS

| 6,083,363 | A | 7/2000 | Ashitiani et al. |
| 6,199,505 | B1* | 3/2001 | Sato et al. ............... 118/723 E |
| 6,998,014 | B2* | 2/2006 | Chen et al. ............. 156/345.34 |
| 7,104,217 | B2* | 9/2006 | Himori et al. ........... 118/723 E |
| 2001/0042799 | A1 | 11/2001 | Kim et al. |
| 2002/0020429 | A1 | 2/2002 | Selbrede et al. |
| 2002/0092471 | A1* | 7/2002 | Kang et al. .................. 118/715 |
| 2003/0052087 | A1 | 3/2003 | Kwon et al. |
| 2003/0075273 | A1 | 4/2003 | Kilpela et al. |
| 2004/0129224 | A1* | 7/2004 | Yamazaki .................... 118/724 |
| 2004/0250770 | A1* | 12/2004 | Nakano et al. .......... 118/723 E |

FOREIGN PATENT DOCUMENTS

| JP | 62-163326 | 7/1987 |
| JP | 03-204925 | 9/1991 |
| JP | 3476687 | 9/2003 |

OTHER PUBLICATIONS

English Machine Translation of JP 2000-100789 A. Obtained from http://www4.ipdl.ncipi.go.jp/cgi-bin/tran_web_cgi_ejje on Feb. 4, 2007.*

* cited by examiner

Primary Examiner—Parviz Hassanzadeh
Assistant Examiner—Maureen G Arancibia
(74) Attorney, Agent, or Firm—Knobbe, Martens, Olson & Bear LLP

(57) ABSTRACT

A dual-chamber plasma processing apparatus comprises two reaction spaces which are equipped with different gas inlet lines and different RF systems. Each reaction space is provided with an RF wave entry path and an RF wave return path to supply RF power from an RF power source and return RF power to the same RF power source.

19 Claims, 5 Drawing Sheets

DUAL-CHAMBER PLASMA PROCESSING APPARATUS

BACKGROUND OF THE INVENTION

1. Field of the Invention

The present invention generally relates to a plasma processing apparatus performing plasma processing such as etching and deposition processing to objects-to-be-processed such as semiconductor wafers. The present invention particularly relates to a plasma processing apparatus having two separate reaction chambers or spaces.

2. Description of the Related Art

For semiconductor device manufacturing, plasma processing such as dry etching and plasma CVD is frequently used.

As an apparatus for performing plasma processing such as dry etching and plasma CVD, for example, the one shown in FIG. 3 is used in JP 3-204925A1. This apparatus possesses an upper electrode 102 and a lower electrode 104 inside the same chamber 105; radio-frequency power sources 110, 111 respectively assigned are connected to the electrodes through radio-frequency matching boxes 108, 109. Multiple processing gases mixed in the previous chamber are supplied to the chamber 105. The upper electrode 102 supplies high-frequency low-power energy, whereas the lower electrode 104 supplies low-frequency high-power energy, thereby avoiding contamination of a substrate surface. At this time, because multiple processing gases are dissociated within the same space, controlling dissociation of each processing gas is difficult. Additionally, for example, if a radio-frequency output applied to one electrode is altered, a plasma state is changed and the other matching situation is also changed. Furthermore, because respective electrodes are at ground potential, installing radio-frequency filters (or band eliminators) 113, 112, etc. may become necessary, which makes a configuration complex.

SUMMARY OF THE INVENTION

The present invention has been achieved in view of the foregoing. In an embodiment of the present invention, instead of supplying processing gases as a mixed gas to the same reaction chamber or space, the present invention provides a plasma processing apparatus capable of supplying multiple processing gases to respective reaction chambers respectively having an independent radio-frequency circuit and capable of controlling excitation of the processing gases separately. In another embodiment, the present invention provides a dual-chamber plasma processing apparatus having simple configurations and applicable to film deposition and etching, which can be operated and controlled independently, in order to form a film on a substrate placed in one of the chambers.

In an embodiment, the present invention provides a dual-chamber plasma processing apparatus comprising: (i) a first evacuatable chamber; (ii) a first radio-frequency (RF) power source; (iii) a first shower plate for introducing a gas into the first chamber, said first shower plate being connected to the first RF power source; (iv) a second shower plate for passing a gas present in the first chamber therethrough, said second shower plate being insulated from the first shower plate; (v) a first RF matching circuit in an enclosure, said circuit being connected to the first shower plate, said enclosure being connected to the second shower plate, wherein RF power applied from the first RF power source to the first shower plate via the first RF matching circuit returns to the first RF power source via the second shower plate and the enclosure for the first RF matching circuit; (vi) a second evacuatable chamber; (vii) a second RF power source; (viii) a support for supporting an object-to-be-processed thereon, said support being connected to the second RF power source, said support being insulated from the second shower plate, wherein the second shower plate is configured to introduce a gas into the second chamber; and (ix) a second RF matching circuit in an enclosure, said circuit being connected to the support, said enclosure being connected to the second shower plate, wherein RF power applied from the second RF power source to the support via the second RF matching circuit returns to the second RF power source via the second shower plate and the enclosure of the second RF matching circuit.

In an embodiment, the matching circuit and the enclosure constitutes a matching box. The enclosure of the matching box may be a partial or entire enclosing portion of the matching box. In the above embodiment, the enclosure is insulated from the matching circuit. However, any member in the vicinity of the matching circuit which has a ground potential can be used as a part of a return path, and thus, the "enclosure" includes such a member regardless of its shape and functions. In an embodiment, such a member can be provided separately from the matching box. In another embodiment, such a member is a part of the matching box, and it may simply be said that RF waves enter and return to the matching box although the matching circuit is an entry path and the enclosure is a return path. In that case, both the enclosure and the matching circuit are referred to simply as the "matching box". Further, in an embodiment where the matching box contacts the chamber, RF waves travel an inner surface of the box or enclosure, which surface connects an inner surface of the chamber. That is, RF waves travel inside the chamber and an inner surface of the chamber and then an inner surface of the matching box. In the above, "connect" includes direct or ultimate-electrical connection and direct or indirect physical connection.

In the above embodiment, because RF energy from the first and second RF power sources returns to the respective RF power sources, and thus RF filters can be eliminated. Further, the matching box can be simplified because no RF interference may occur due to the use of separated chambers and no plasma impedance may significantly change. An impedance change, if any, may be due to changes in the gas type, flow rate, and pressure, but not due to interference between different RF energies. The matching boxes in the embodiment may mainly be used for rectifying the frequency of RF power. In this embodiment, it is possible to conduct highly controlled deposition or etching by separately controlling the first and second chambers.

The above embodiment includes, but is not limited to, the following embodiments:

The first shower plate and the support may be provided with a heater so that the first and second chambers can be more independently controlled.

The second shower plate may have two gas flow paths separated from each other, one path comprising holes passing through the second shower plate, the other path comprising an enclosed compartment connected to an external gas supply line and having multiple holes on its lower surface. The second shower plate may be comprised of an upper shower plate and a lower shower plate, wherein the upper shower plate is connected to the first chamber, the lower shower plate is connected to the second chamber, and wherein when the second chamber is at the position for processing, the upper shower plate and the lower shower plate are gas-tightly connected. In the above, the upper shower plate and the lower shower plate may be sealed using an O-ring. Further, the lower shower plate may have two gas flow paths separated from each other, a first path comprising holes passing through the lower shower plate, a second path comprising an enclosed compartment connected to an external gas supply line via the upper shower plate and having multiple holes on its lower surface, and wherein the upper shower plate has holes corresponding to the holes of the first path of the lower shower plate, and the external gas supply line is connected to the upper shower plate.

The above embodiments can preferably be applied to a configuration where the second chamber is movable to a position for processing and to a position for loading and unloading an object-to-be-processed.

The first shower plate may be connected to an external gas supply line which is different from an external gas supply line connected to the second shower plate.

The first chamber may have an inner sidewall which is conductive and connected to the second shower plate but insulated from the first shower plate. The second chamber may have an inner sidewall which is conductive and connected to the second shower plate but insulated from the support. Further, the second chamber may be connected to an exhaust system.

The first RF matching box and the second RF matching box may have no RF filter. Further, in an embodiment, no RF filter is provided not only in the RF matching box but also in other portions of the apparatus.

In another embodiment, the present invention provides a dual-chamber plasma processing apparatus comprising: (i) a first evacuatable chamber; (ii) a first radio-frequency (RF) power source; (iii) a first shower plate for introducing a first gas into the first chamber, said first shower plate being connected to the first RF power source; (iv) an intermediate shower plate for passing gas present in the first chamber therethrough, said intermediate shower plate being insulated from the first shower plate; (v) a first RF matching circuit in an enclosure, said circuit being connected to the first shower plate, said enclosure being connected to the intermediate shower plate, wherein RF power applied from the first RF power source to the first shower plate via the first RF matching box returns to the first RF power source via the intermediate shower plate and the enclosure for the first RF matching circuit; (vi) a second evacuatable chamber; (vii) a second RF power source; (viii) a support for supporting an object-to-be-processed thereon, said support being connected to the second RF power source; (ix) a second shower plate for introducing a second gas and passing gas present in the first chamber therethrough into the second chamber, said second shower plate being insulated from the support; and (x) a second RF matching circuit in an enclosure, said circuit being connected to the support, said enclosure being connected to the second shower plate, wherein RF power applied from the second RF power source to the support via the second RF matching box returns to the second RF power source via the second shower plate and the enclosure for the second RF matching circuit.

In still another embodiment, the present invention provides a dual-chamber plasma processing apparatus comprising: (i) a first evacuatable chamber to which a gas is introduced; (ii) a top plate disposed in and insulated from the first chamber; (iii) a first external radio-frequency (RF) power source and a first RF matching box for applying RF power to the top plate via the first RF matching box; (iv) a second evacuatable chamber to which a gas is introduced; (v) a support disposed in the second chamber for supporting an object-to-be-processed thereon; and (vi) a second external RF power source and a second RF matching box for applying RF power to the support via the matching box, wherein the RF power applied to the top plate from the first RF power source and the RF power applied to the support from the second RF power source return to the first and second RF power sources, respectively, via an inner surface of the first chamber and an inner surface of the first RF matching box and via an inner surface of the second chamber and an inner surface of the second RF matching box, respectively. In this embodiment, the top plate need not be a shower plate such as a showerhead having numerous pores, and the top plate can be a plate having at least one nozzle for introducing gas into the first chamber. In a preferable embodiment, the top plate may be a shower plate having a number of gas blowoff pores.

The above embodiment includes, but is not limited to, the following embodiments:

The first and second chambers may be each connected to different gas supply lines.

Excitation of respective gases introduced to the respective first and second chambers may be controlled separately. Further, the first shower plate and the support may be provided with a heater.

In a preferable embodiment, the plasma processing apparatus may further comprise at a bottom of the first chamber an upper shower plate through which excited gas in the first chamber passes to the second chamber. Additionally, the plasma processing apparatus may further comprise on top of the second chamber a lower shower plate having a number of pores for emitting excited gas from the first chamber to the second chamber and a number of pores for emitting a processing gas from an external source to the second chamber. In another embodiment, an intermediate plate having at least one nozzle for passing the gas in the first chamber and at least one nozzle for introducing a gas into the second chamber can be used. The intermediate plate or the upper/lower shower plate may be constituted by a conductive material such as aluminum. In the above, the upper shower plate and the lower shower plate may be separate portions. In another embodiment, the upper shower plate and the lower shower plate may be integrated. In a preferable embodiment, the first RF power source and the second RF power source can be independently controllable. Further, the first and second chambers may be each surrounded by an electrically conductive sidewall. In these embodiments, RF energies from the first and second RF power sources can effectively return to the respective power sources without causing unwanted interference between different RF energies and between different gases.

In still another embodiment, the present invention provides a dual-chamber plasma processing apparatus comprising: (i) a first reaction chamber for a plasma generated by RF waves applied from an upper electrode provided therein, wherein a gas supply system is connected to the first reaction chamber; (ii) a second reaction chamber for a plasma generated by RF waves applied from a lower electrode provided therein, wherein an object-to-be-treated is placed in the second reaction chamber, and a gas supply system and a gas discharge system are connected to the second reaction chamber; and (iii) an electrically conductive plate for dividing the first reaction chamber and the second reaction chamber, said plate being capable of passing gas from the first reaction chamber to the second reaction chamber, wherein the RF waves applied from the upper electrode and the RF waves applied from the lower electrode are separately controlled and return to the upper electrode and the lower electrode via the plate, respectively. In a preferable embodiment, the upper electrode may be a shower plate connected to the gas supply system. In a preferable embodiment, the lower electrode may be a susceptor. In a preferable embodiment, the electrically conductive plate may be a shower plate connected to the gas supply system.

In yet another embodiment, the present invention provides a dual-chamber plasma processing apparatus comprising two reaction spaces connected in fluid communication where a substrate is to be placed in one of the reaction spaces, said reaction spaces being equipped with different gas inlet lines and different RF systems, each reaction space being provided with an RF wave entry path and an RF wave return path to supply RF power to the reaction space from an RF power source and return the RF power to the same RF power source. This embodiment relates to the two reaction spaces and the RF wave return path provided in each of the reaction space. Accordingly, each reaction space can be separately controlled. This embodiment includes, but is not limited to, the following further embodiments:

The two reaction spaces are an upper reaction space and a lower reaction space, and the substrate is to be placed in the lower reaction space. The upper reaction space comprises an upper shower plate for introducing gas into the upper reaction space, and the lower reaction space comprises a susceptor on which the substrate is to be placed. The upper reaction space and the lower reaction space are separated by an intermediate shower plate which passes gas from the upper reaction chamber to the lower reaction chamber and introduces gas from an external gas source into the lower reaction space. The RF wave entry path in the upper reaction space is constituted by the upper shower plate, and the RF wave return path in the upper reaction space is constituted by the intermediate shower plate and an inner wall surrounding the upper reaction space. The RF wave entry path in the lower reaction space is constituted by the susceptor, and the RF wave return path in the lower reaction space is constituted by the intermediate shower plate and an inner wall surrounding the lower reaction space. The RF system for the upper reaction space includes an upper RF matching box through which RF power is supplied to the upper reaction space via the RF wave entry path, and to which the RF power returns via the RF wave return path. The RF system for the lower reaction space includes a lower RF matching box through which RF power is supplied to the lower reaction space via the RF wave entry path, and to which the RF power returns via the RF wave return path. The RF system for the upper reaction space is provided with no band filter. The RF system for the lower reaction space is provided with no band filter. The intermediate shower plate is comprised of a top plate and a bottom plate which are separably attached, and the lower reaction space moves between a processing position and a loading/unloading position, wherein the bottom plate moves with the lower reaction space.

In all of the aforesaid embodiments, any element used in an embodiment can interchangeably be used in another embodiment unless such a replacement is not feasible or causes adverse effect. Further, the present invention can equally be applied to methods using the above described apparatuses.

In another aspect, the present invention provides a method of plasma CVD using any suitable aforesaid dual-chamber plasma possessing apparatus, comprising: (a) introducing a gas to the first chamber; (b) introducing a gas to the second chamber; (c) applying RF power from the first RF power source to the first chamber via the first RF matching box and the first shower plate, thereby exciting the gas in the first chamber; (d) returning RF power to the first RF power source via the second shower plate and the first RF matching box; (e) applying RF power from the second RF power source to the second chamber via the second RF matching box and the support, thereby exciting the gas in the second chamber to treat the object-to-be-processed; and (f) returning RF power to the second RF power source via the second shower plate and the second RF matching box, without interfering with the RF power returning to the first RF power source.

In another embodiment, the present invention provides a method of plasma CVD using any suitable aforesaid dual-chamber plasma possessing apparatus, comprising: (a) introducing a gas to the first chamber; (b) introducing a gas to the second chamber; (c) applying RF power from the first RF power source to the first chamber via the first RF matching box and the first shower plate, thereby exciting the gas in the first chamber; (d) returning RF power to the first RF power source via the intermediate shower plate and the first RF matching box; (e) applying RF power from the second RF power source to the second chamber via the second RF matching box and the support, thereby exciting the gas in the second chamber to treat the object-to-be-processed; and (f) returning RF power to the second RF power source via the second shower plate and the second RF matching box, without interfering with the RF power returning to the first RF power source.

In still another embodiment, the present invention provides a method of plasma CVD using any suitable aforesaid dual-chamber plasma possessing apparatus, comprising: (a) introducing a gas to the first chamber; (b) introducing a gas to the second chamber; (c) applying RF power from the first RF power source to the first chamber via the first RF matching box and the top plate, thereby exciting the gas in the first chamber; (d) returning RF power to the first RF power source via the inner surface of the first chamber and an inner surface of the first RF matching box; (e) applying RF power from the second RF power source to the second chamber via the second RF matching box and the support, thereby exciting the gas in the second chamber to treat the object-to-be-processed; and (f) returning RF power to the second RF power source via the inner surface of the second chamber and an inner surface of the second RF matching box, without interfering with the RF power returning to the first RF power source.

In the above methods, the treatment of the object-to-be-processed may be deposition of a film on the object-to-be-treated. For this purpose, TEOS or silane can be used as a source gas. Further, the treatment of the object-to-be-processed may be etching of a film formed on the object-to-be-treated. For this purpose, $C_2F_6$ or $C_3F_8$ can be used as an etching gas. In either case, an inactive gas such as nitrogen or rare gas such as He or Ar can be used as a carrier gas.

In the foregoing, any elements in an embodiment can be interchangeably with other elements in another embodiment.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

According to the present invention, in an embodiment, a chamber is divided into a first reaction chamber for a plasma generated by RF waves applied from an upper electrode and a second reaction chamber for a plasma generated by RF waves applied from a lower electrode, by an electrically conductive plate capable of passing gas from the first reaction chamber to the second reaction chamber, wherein the RF waves applied from the upper electrode and the RF waves applied from the lower electrode are separately controlled. By supplying multiple processing gases to the independent reaction chambers, it becomes possible to control excitation of processing gasses separately. As explained above, the present invention can be accomplished in various ways including, but not limited to, the above mentioned embodiments.

The invention will be explained further with reference to specific embodiments, but the invention should not be limited thereto.

Figure 1:
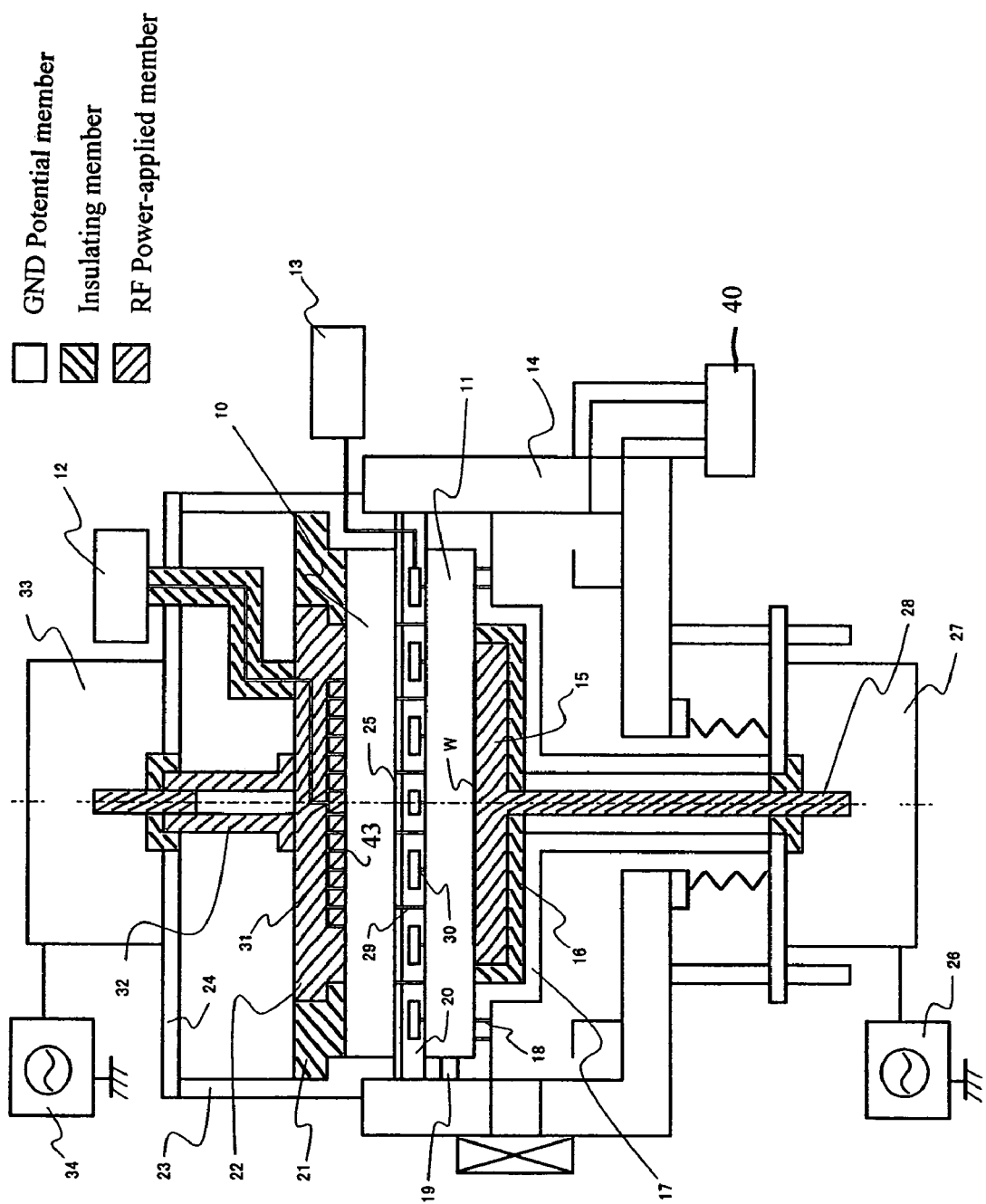
FIG. 1 is a schematic cross-sectional view of the plasma processing apparatus according to an embodiment of the present invention.

FIG. 1 is a schematic cross-sectional view of the plasma processing apparatus according to an embodiment of the present invention. FIG. 1 indicates ground potential members, insulating members, and RF power-applied members by no hatching and two different hatchings, respectively. In FIG. 1, numeral 14 represents, for example, an atmospheric-pressure-resistant chamber made of aluminum or ceramics.

Inside the chamber 14, a stage 15 is set up for supporting a semiconductor wafer W, which is an object to be processed. This supporting stage 15 comprising an electrically conductive member made of aluminum, etc. or a ceramic structural member includes an electrically conductive electrode embedded therein and serves as a lower electrode. For example, the stage 15 may comprise a aluminum nitride body in which an electrode is embedded in patterns. The electrode may be constituted by molybdenum which has a thermal expansion coefficient similar to that of aluminum.

The supporting stage 15 is placed on a reaction space chassis 17 comprising an electric conductor made of aluminum, etc. through an insulator 16. The reaction space chassis 17 surrounds a reaction space 11 and possesses an exhaust hole 18, a wafer-handling portion 19 and a shower plate 20, which are electrically connected by screws, etc.

Additionally, inside the chamber 14, an electrically conductive upper electrode 22 made of aluminum, etc. is provided and is placed on an insulating member 21. The insulating member 21 is placed on a reaction space chassis 23. The reaction space chassis 23 surrounds a reaction space 10 and possesses a reaction space top plate 24 and a shower plate 25, which are electrically connected by screws, etc.

The insulating members 16, 21 may be constituted by alumina ceramics. In another embodiment, they can be constituted by quartz or super engineering plastics such as VESPEL® (manufactured by DuPont; aromatic polyimide resin) or PBI® (commonly called CELAZOLE) (manufactured by Clariant; polybenzoimidazole).

Although any material having low relative permeability can be used in the reaction space chasses 17, 23, they may preferably be constituted by aluminum in view of metal contamination during processes, cost, weight, etc.

For the lower reaction space 11, a radio-frequency power source 26 set up on the lower side of the chamber 14 is connected to the supporting stage 15 by a power-transmitting member 28 via a matching box 27. Around the power-transmitting member 28, an electrically conductive member extending downward from the reaction space chassis 17 is electrically connected to a matching-box 27 by screws, etc. The matching circuit in the matching box can be any suitable circuit for matching RF waves such as those disclosed in JP 3-204925A1, the disclosure of which is incorporated herein by reference.

A shower plate is installed on the top plate of the reaction space 11 and has pores 30 for emitting a jet of processing gas to be dissociated in the reaction space 11; the processing gas is supplied from a processing-gas supply source 13.

For the upper reaction space 10, a radio-frequency power source 34 is connected to the electrode 22 by a power-transmitting member 32 via a matching box 33. The reaction space chassis 23 encloses the electrode 22 and the power-transmitting member 32 via the insulating member 21 and is electrically connected to a matching-box 33 by screws, etc. In the figures, the radio-frequency power source 34 is indicated near the upper side of the chamber 14. However, the power source 34 can be placed in any place. Similarly, the matching box 33 need not be disposed directly above the top of the chamber 14 (or the top of the chassis 23), although it is preferable to dispose the matching box 33 in the vicinity of the chassis 23 to easily establish electrical connection therebetween. As with the above, the power source 26 and the matching box 27 can be disposed in any place.

A shower plate 31 is installed on the top plate of the reaction space 10 and has pores 43 for emitting a jet of processing gas to be dissociated in the reaction space 10; the processing gas is supplied from a processing-gas supply source 12.

A shower plate 25 is installed on the undersurface of the reaction space 10 and has pores 29 for emitting a jet of processing gas dissociated in the reaction space to the reaction space 11. Pores 29, 30 are independent of each other; processing gases are not mixed inside the shower plate 20 and the shower plate 25.

The shower plates 20, 25, 31 may be constituted by aluminum. The surface of the shower plate can be coated with an anodized oxide film (an oxide film deposits on the shower plate serving as an anode) or with ceramic by flame spray coating.

The upper reaction space 10 and the lower reaction space 11 are evacuated by an exhaust device 40 through the hole 18 and pores 29.

Figure 5:
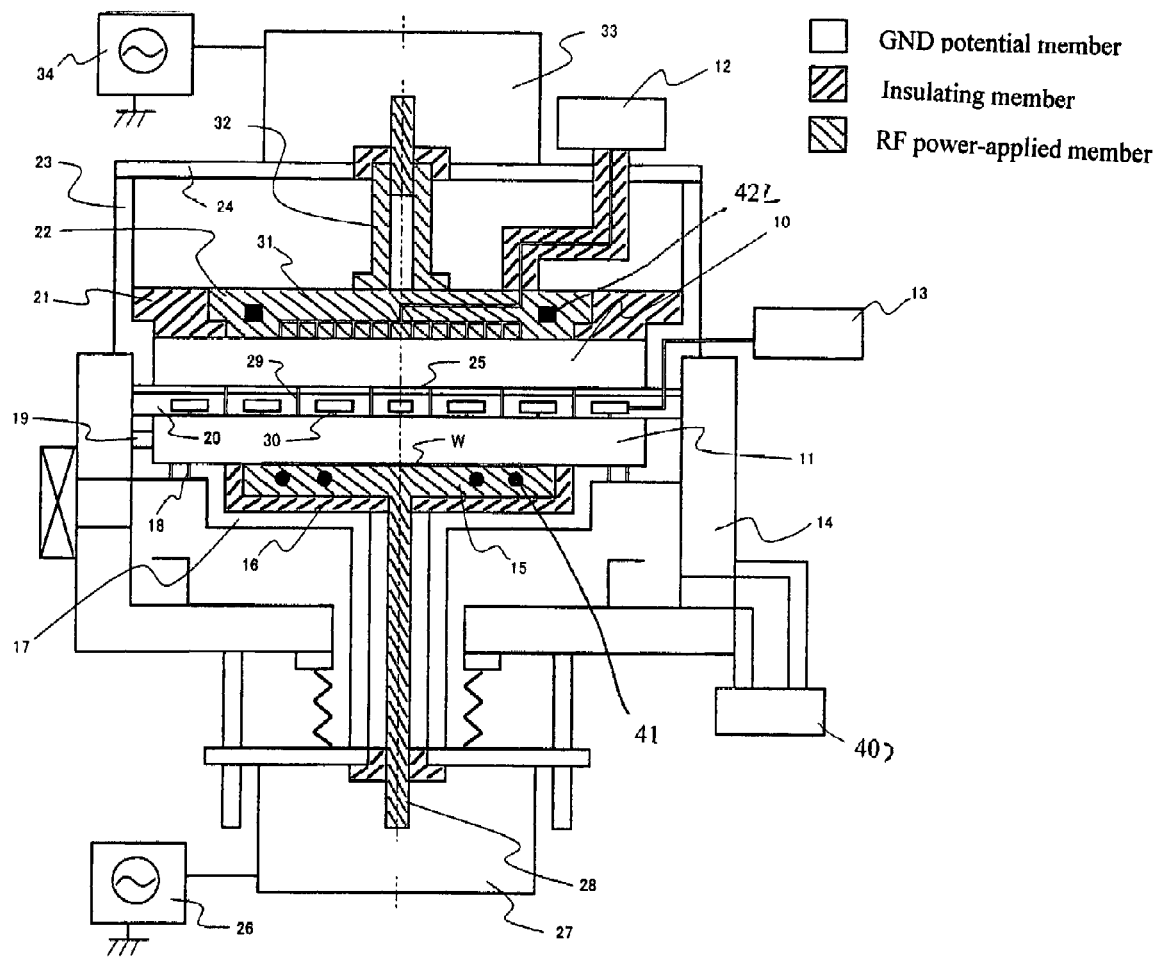
FIG. 5 is a schematic cross-sectional view of the plasma processing apparatus according to another embodiment of the present invention.

As shown in FIG. 5, in an embodiment, the susceptor 15 can be equipped with a heater 41, and the electrode 22 also can be equipped with a heater 42, in order to adjust the temperature of the upper reaction space 10 and the lower reaction space 11, depending on the type of gasses, the type of film, the type of reaction, etc. The heaters 41 and 42 can be replaced by or provided with a cooling system using a fluorine coolant such as Galden® (manufactured by Solvay Solexis) and Fluorinert™ (manufactured by 3M).

Figure 2:
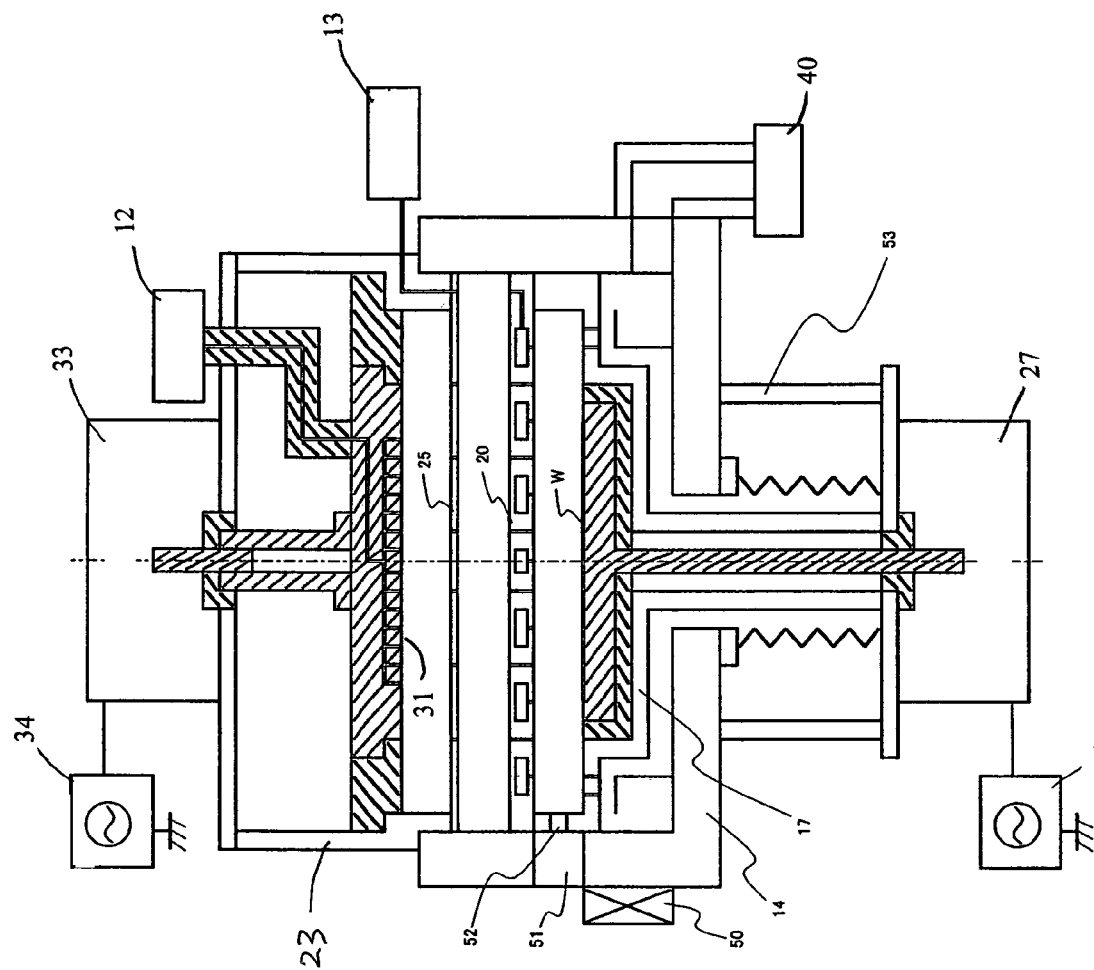
FIG. 2 is a schematic cross-sectional view of a semiconductor wafer handling position of the apparatus shown in FIG. 1.
Figure 3:
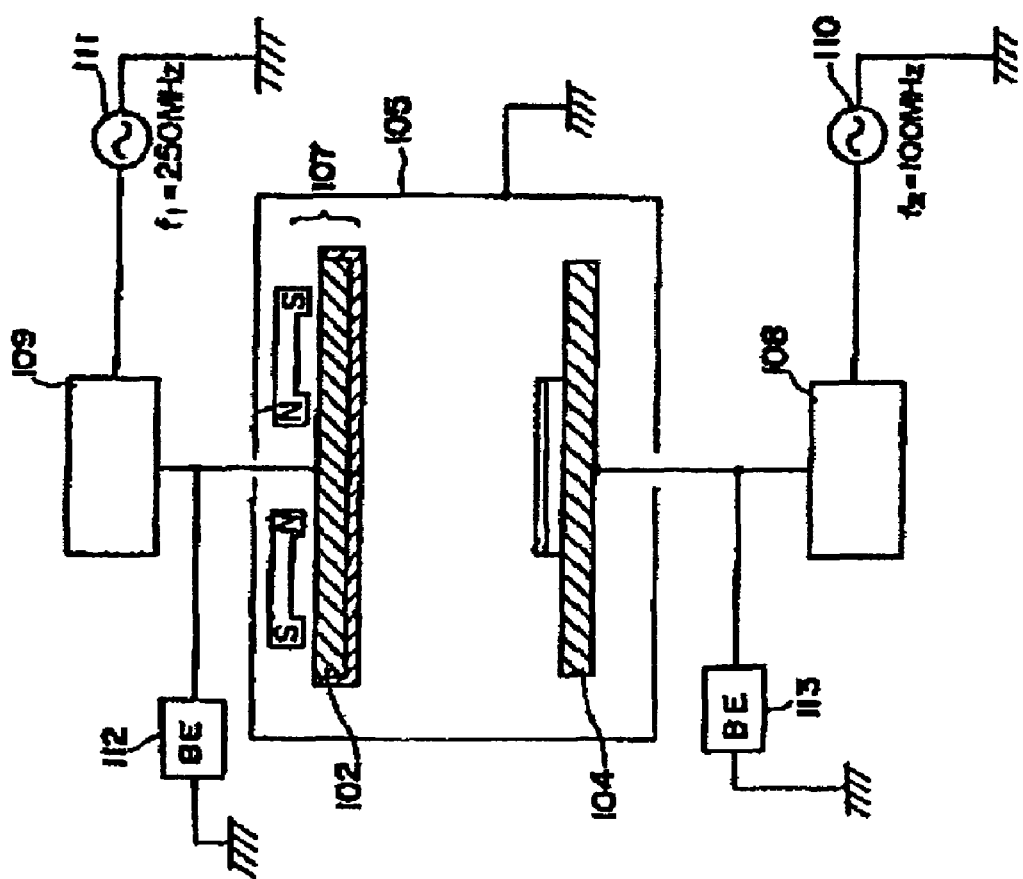
FIG. 3 is a schematic cross-sectional view of a conventional plasma processing apparatus (JP 03-204925).

FIG. 2 shows a position of the reaction space chassis 17 at the time of handling a wafer W. At the time of handling the wafer, a gate valve 50 installed in the chamber 14 descends and passes opening portions 51, 52, and the wafer W is handled by a handling robot (not shown). After the wafer has been handled, the reaction space chassis 17 ascends by an elevating mechanism 53 (details omitted) and contacts the undersurface of the shower plate 25. A vacuum seal is installed on the upper surface of the shower plate 20 for sealing respective processing gases within the reaction spaces, and the configuration provided ensures that processing gases are not exhausted from the outer peripheral portion of the reaction space chassis 17. At this time, an upward output of the elevating mechanism is set sufficiently to collapse a protruding portion of the vacuum seal completely. In this position, processing gas is emitted and radio-frequency power is applied to the respective electrodes to generate plasma, and given plasma processing is performed to a semiconductor wafer W.

A seal between the shower plate 20 and the shower plate 25 can be accomplished by an O-ring made of a resin or a C-ring made of a metal used as a sealing member, for example.

In an embodiment, the sealing member can be constituted by an insulating material such as fluorocarbon material (e.g., Viton™ manufactured by Viton, USA) or perfluorocarbon rubbers (e.g., Dupra™ manufactured by Daikin, Japan, Chemraz™ manufactured by Greene Tweed, USA). In another embodiment, an O-ring-shaped gasket comprises a tubular coil spring which is covered by a metal having a C-shaped cross section. A metallic coating may be used which is constituted by a heat-resistant and corrosion-resistant metal material such as aluminum.

In embodiment, the shower plate 20 and the shower plate 25 may be electrically in contact with each other, or may be insulated from each other at a processing position, as long as the shower plates 20 and 25 are electrically connected to the reaction space chasses 17 and 23, respectively, so that RF energy can return to the original source.

In another embodiment, the shower plate 20 may be attached to the reaction space chassis 23, instead of the reaction space chassis 17, wherein the shower plate 25 and the shower plate 20 are integrated. In this embodiment, an upper portion of the reaction space chassis 17 and the shower plate 20 become in electrically and gas-tightly contact with each other at the processing position.

The distance between the shower plate 31 and the shower plate 25 may be in the range of about 5 mm to about 300 mm (including 10 mm, 50 mm, 100 mm, 200 mm, and ranges between any two numbers of the foregoing, preferably about 10 mm to about 50 mm), and the diameter of the shower plate 25 may be in the range of about 100 mm to about 600 mm, preferably about 200 mm to about 400 mm (depending on the size of the object-to-be-treated). The distance between the shower plate 20 and the susceptor 15, and the diameter of the shower plate 20 can preferably be the same as above.

The RF power source 34 and the RF power source 26 may supply RF waves at a frequency of about 100 kHz to about 150 MHz (including 200 kHz, 400 kHz, 1 MHz, 10 MHz, 30 MHz, 100 MHz, and ranges between any two numbers of the foregoing) with power of about 100 W to about 10 kW (including 200 W, 500 W, 1 kW, 5 kW, and ranges between any two numbers of the foregoing). The frequency and power of the RF power source 34 may be the same as or different from those of the RF power source 26, depending on the type of gases used, the type of film formed, etc.

The electrode 22 and the susceptor 15 need not be charged simultaneously. In an embodiment, only the electrode 22 exerts RF power, and in another embodiment, only the susceptor 15 exerts RF power.

Additionally, the susceptor 15 and the electrode 22 need not be but may be equipped with the heaters 41 and 42, respectively. Further, in addition to the heaters or in place of the heaters, a cooling system such as a water jacket (now shown) can be provided in the susceptor 15 and/or the electrode 22. The temperature of each of the upper reaction space 10 and the lower reaction space 11 can independently be controlled between about −50° C. to a temperature below a melting point of the material of the electrode (e.g., 50° C. to 500° C.). For example, when the electrode is made of aluminum, the upper temperature may be 500° C. or lower, and when the electrode is made of aluminum nitride, the upper temperature may be 600° C. or lower. The temperature can be adjusted to a temperature required for the reaction in progress. In another embodiment, only one of the susceptor 15 or the electrode 22 may be equipped with a heater. Further, the pressure in the reaction spaces 10 and 11 can be adjusted to a pressure required for the reaction in progress using the vacuum pump 40 connected to the reaction space 11.

Figure 4:
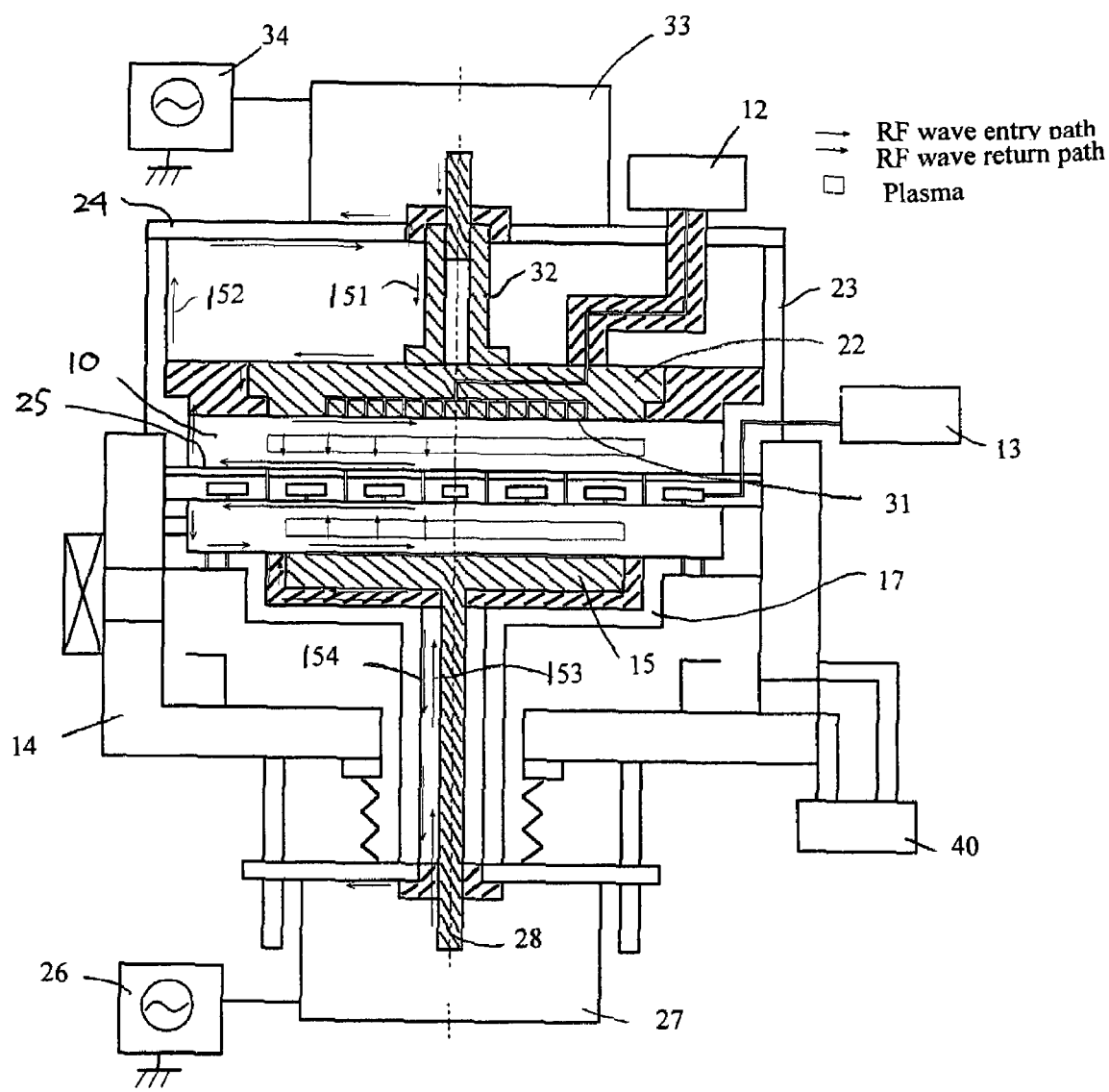
FIG. 4 is a view of plasma return paths in the apparatus shown in FIG. 1 in an embodiment.

In an embodiment of the present invention, the apparatus is provided with two separate RF power return paths formed in respective reaction chambers (e.g., upper and lower reaction chambers). FIG. 4 shows these two paths, wherein RF wave entry paths are indicated with arrows with thicker heads, and RF wave return paths are indicated with arrows with thinner heads.

A first path is constituted by a first entry path 151 and a first return path 152. The first entry path is constituted by the RF matching box 33, the power-transmitting member 32, the electrode 22, and the shower plate 31. RF waves travel on a surface of each material (known as "skin effect") as shown with arrows in FIG. 4. Thus, as long as surfaces are connected, RF waves can travel. RF waves then enter into the upper reaction space 10 and are received by the shower plate 25. The first return path is constituted by the shower plate 25, the upper reaction space chassis 23, the top plate 24, and an enclosure of the RF matching box 33. The electrode 22 and the upper reaction space chassis 23 are insulated by the insulating member 21. The second entry path 153 is constituted by the RF matching box 27, the power-transmitting member 28, and the susceptor 15. RF waves then enter into the lower reaction space 11 and are received by the shower plate 20. The second return path 154 is constituted by the shower plate 20, the upper reaction space chassis 17, and an enclosure of the RF matching box 27. The susceptor 15 and the lower reaction space chassis 17 are insulated by the insulating member 16. The shower plate 25 and the shower plate 20 may or may not be insulated. Because RF waves return generally to the same RF matching box, controlling application of upper and lower RF powers becomes significantly easy and stable due to minimum interference with each other. No band filter is required.

As long as the RF wave traveling path is formed by an electrically conductive path and constituted by an entry path and a return path connected via a reaction space, the traveling route can vary, depending on the configuration of the apparatus. For example, in the above embodiment, the lower reaction chassis 17 serves as the return path, but the lower reaction chassis 17 need not be used if an inner wall of the chamber 14 itself can serve as a return path (e.g., a dual wall chamber). Further, the upper reaction chassis 23 and the top plate 24 are shaped in a box, but they can be shaped similarly to the lower reaction space chassis 17, i.e., formed around the power-transmitting member 32. Further, as long as RF waves travel, the area of the path can vary, and the entire surface need not be used. The path can be comprised of one or more stripes in various shapes. In the above, when using the chasses 17 and 23, the return paths can be shorter than when constituting the return paths somewhere else, thereby improving efficiency. Further, by this configuration, it is possible to avoid the occurrence of an abnormal electric discharge in an underside or unexpected location.

Further, the shower plate 25 and the shower plate 20 need not be separate plates. As long as electrical connection is established between the chassis and the shower plate, the shower plate 25 and the shower plate 20 can be integrated as one shower plate which can be attached to either the upper reaction chassis 23 or the lower reaction chassis 17, or can be attached to the chamber 14 in an unmovable fashion. In the aforesaid embodiment, for the sake of convenient and secure electrical connection, preferably, the shower plate 25 and the shower plate 20 are separately used, which are attached to the lower reaction chassis 17 and the upper reaction chassis 23, respectively. In that case, electrical connection between the shower plate 20 and the lower reaction chassis 17 and between the shower plate 25 and the upper reaction chassis 23 is always established. The shower plate 20 and the shower plate 25 need not be electrically connected.

In the above, the upper RF power and the lower RF power need not be operated simultaneously. They can be operated independently. When using thermally reactive gases, no RF power need to be activated. In an embodiment, only one of the upper or lower RF power is activated, whichever treats gas requiring plasma energy for excitation. Gas B introduced from the gas source 13 into the lower reaction space 111 through the shower plate 20 does not enter into the upper reaction space 10. Gas A introduced from the gas source 12 into the upper reaction space 10 through the shower plate 31 enters into the lower reaction space 11 after gas A is subjected to desired treatment in the upper reaction space 10 (e.g., plasma treatment or thermal treatment for excitation). Gas A and gas B do not contact each other in the upper reaction space 10 and contact first in the lower reaction space 11. Even when gas A and gas B are highly reactive, because they are separated until the entry into the lower reaction space 11, unwanted reaction or deposition can effectively be avoided. Each reaction space can individually provide desirable excitation conditions (e.g., RF frequency, RF power, temperature, etc.). In FIG. 5, although one exhaust device 40 is used which evacuates both the upper and lower reaction spaces, a separate exhaust device can be provided for the upper reaction space 10.

The shower plate 31 is provided with pores 43, the shower plate 25 is provided with pores 29, and the shower plate 20 is provided with pores 29 and 30. The pores 29 in the shower plate 20 are through holes which are separated from and are not communicated with the interior of the shower plate 20 which interior is communicated with the pores 30. When the shower plate 25 and the shower plate 20 are in contact with each other, thereby accomplishing sealing therebetween, the pores 29 is established through the shower plate 25 and the shower plate 20. The number of pores is not limited, and at least one pore up to several thousands pores can be provided. The number, size, location, layout, and shape of pores can vary, as long as uniform gas flow can be achieved. These parameters can be independently determined for the pores 43, 29, and 30.

According to an embodiment of the present invention, independent reaction spaces are provided in the chamber and processing gas is introduced to the respective reaction spaces. By providing independent radio-frequency circuits for respective reaction spaces, it becomes possible to restrain mutual radio-frequency interference and it becomes possible to control dissociation of multiple processing gases independently.

In the case of a conventional capacitively-coupled plasma source, because multiple processing gases were introduced to the same processing container and multiple radio-frequency waves were applied, it was difficult to control dissociation of processing gases individually and independently.

The present invention can be applied to film formation and etching processes.

In an example, plasma CVD can be performed using the apparatus indicated in FIG. 1 or 5, for example. Various source gas can be selected for plasma CVD in view of its dissociation energy, for example. For example, the dissociation energy of H—H bond is 432 kJ/mol, and that of C=C bond is 719 kJ/mol. When source gases (including liquid material) contain these bonds, and active species are generated under conditions where only target atomic bonds are desirably subject to dissociation and a part having high dissociation energy is desirably not subject to dissociation, the apparatus can effectively be utilized. That is, because there are two separate reaction spaces to which source gas and RF power can be individually and independently provided, it is possible to control dissociation processes by individually selecting an RF power frequency suitable for each source gas.

In another example, etching can be performed using the apparatus indicated in FIG. 1 or 5, for example. For etching of an insulation film, multiple gases including gas for generating radicals serving as etchent species and deposition gas for protecting an inner wall may be used. In that case, the gas generating etchent species is introduced into the upper reaction space, whereas the deposition gas is introduced into the lower reaction space. Each gas can be excited using an RF power frequency specifically suitable for the gas, which RF power can be applied individually to each reaction space.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A dual-chamber plasma processing apparatus comprising:
  a first evacuatable chamber;
  a first radio-frequency (RF) power source;

a first shower plate for introducing a gas into the first chamber, said first shower plate being connected to the first RF power source;

a second shower plate for passing a gas present in the first chamber therethrough, said second shower plate being insulated from the first shower plate;

a first RF matching circuit in an enclosure, said circuit being connected to the first shower plate, said enclosure being connected to the second shower plate, wherein RF power applied from the first RF power source to the first shower plate via the first RF matching circuit returns to the first RF power source via the second shower plate and the enclosure for the first RF matching circuit;

a second evacuatable chamber;

a second RF power source;

a support for supporting an object-to-be-processed thereon, said support being connected to the second RF power source, said support being insulated from the second shower plate, wherein the second shower plate is configured to introduce a gas into the second chamber; and a second RF matching circuit in an enclosure, said circuit being connected to the support, said enclosure being connected to the second shower plate, wherein RF power applied from the second RF power source to the support via the second RF matching circuit returns to the second RF power source via the second shower plate and the enclosure for the second RF matching circuit, wherein the second chamber is mechanically movable to a position for processing and to a position for loading and unloading an object-to-be-processed, wherein the second shower plate has two gas flow paths gaseously separated from each other, one path comprising holes passing through the second shower plate, the other path comprising an enclosed compartment connected to an external gas supply line and having multiple holes on its lower surface, wherein the second shower plate is comprised of an upper shower plate and a lower shower plate, said upper shower plate being fixed to the first chamber, said lower shower plate being fixed to the second chamber, wherein the upper shower plate and the lower shower plate are insulated from each other, and are gas-sealable and -separable from each other by mechanical movement of the second chamber relative to the first chamber.

2. The dual-chamber plasma processing apparatus according to claim 1, wherein the upper shower plate and the lower shower plate are sealed using an O-ring.

3. The dual-chamber plasma processing apparatus according to claim 1, wherein the lower shower plate has two gas flow paths separated from each other, a first path comprising holes passing through the lower shower plate, a second path comprising an enclosed compartment connected to an external gas supply line via the upper shower plate and having multiple holes on its lower surface, and wherein the upper shower plate has holes corresponding to the holes of the first path of the lower shower plate, and the external gas supply line is connected to the upper shower plate.

4. The dual-chamber plasma processing apparatus according to claim 1, wherein the first shower plate is connected to an external gas supply line which is different from an external gas supply line connected to the second shower plate.

5. The dual-chamber plasma processing apparatus according to claim 1, wherein the first chamber has an inner sidewall which is conductive and connected to the second shower plate but insulated from the first shower plate.

6. The dual-chamber plasma processing apparatus according to claim 1, wherein the second chamber has an inner sidewall which is conductive and connected to the second shower plate but insulated from the support.

7. The dual-chamber plasma processing apparatus according to claim 1, wherein the second chamber is connected to an exhaust system.

8. The dual-chamber plasma processing apparatus according to claim 1, wherein the first RF matching circuit and the second RF matching circuit are provided with no RF filter.

9. The dual-chamber plasma processing apparatus according to claim 1, werein the first shower plate and the support are provided with a heater.

10. A dual-chamber plasma processing apparatus comprising:

a first evacuatable chamber to which a gas is introduced;

a top shower plate disposed in and insulated from the first chamber;

a first external radio-frequency (RF) power source and a first RF matching box for applying RF power to the top shower plate via the first RF matching box;

a second evacuatable chamber to which a gas is introduced;

a support disposed in the second chamber for supporting an object-to-be-processed thereon; and a second external RF power source and a second RF matching box for applying RF power to the support via the matching box, wherein the RF power applied to the top shower plate from the first RF power source and the RF power applied to the support from the second RF power source return to the first and second RF power sources, respectively, via an inner surface of the first chamber and an inner surface of the first RF matching box and via an inner surface of the second chamber and an inner surface of the second RF matching box, respectively, said dual-chamber plasma processing apparatus further comprising:

at a bottom of the first chamber an upper shower plate through which excited gas in the first chamber passes to the second chamber; and on top of the second chamber a lower shower plate having a number of pores for emitting excited gas from the first chamber to the second chamber and a number of pores for emitting a processing gas from an external source to the second chamber, wherein the upper shower plate and the lower shower plate are insulated from each other, and are gas-sealable and -separable from each other by mechanical movement of the second chamber relative to the first chamber.

11. The dual-chamber plasma processing apparatus according to claim 10, wherein the first and second chambers are each connected to different gas supply lines.

12. The dual-chamber plasma processing apparatus according to claim 10, wherein excitation of respective gases introduced to the respective first and second chambers is controlled separately.

13. The dual-chamber plasma processing apparatus according to claim 10, wherein the top plate is a shower plate having a number of gas blowoff pores.

14. The dual-chamber plasma processing apparatus according to claim 10, wherein the first RF power source and the second RF power source are independently controllable.

15. The dual-power plasma processing apparatus according to claim 10, wherein the first and second chambers are each surrounded by an electrically conductive sidewall.

16. The dual-chamber plasma processing apparatus according to claim 10, wherein the first shower plate and the support are provided with a heater.

17. A dual-chamber plasma processing apparatus comprising:
- a first evacuatable chamber;
- a first shower plate for introducing a gas into the first chamber, said first shower plate being enclosed by a first conductive chassis insulated from the first shower plate;
- a second shower plate for passing a gas present in the first chamber therethrough, said second shower plate being insulated from the first shower plate and connected to the first conductive chassis;
- a first RF matching circuit in an enclosure, said circuit being connected to the first shower plate, said enclosure being connected to the first conductive chassis;
- a second evacuatable chamber movable between a processing position and an object transferring position;
- a support for supporting an object-to-be-processed thereon in the second evacuatable chamber, said support being insulated from the second shower plate and enclosed by a second conductive chassis insulated from the support; and
- a second RF matching circuit in an enclosure, said circuit being connected to the support, said enclosure being connected to the second conductive chassis,
- wherein the second shower plate is comprised of an upper shower plate and a lower shower plate constituting different gas flow paths gaseously separated from each other, said lower shower plate being attached to the second conductive chassis, said upper shower plate and said lower shower plate being separated from each other when the second evacuatable chamber is at the object transferring position, said upper shower plate and said lower shower plate being attached when the second evacuatable chamber is at the processing position,
- wherein the lower shower plate, the second conductive chassis, and the support moves together when the second evacuatable chamber mechanical moves relative to the first evacuatable chamber,
- wherein the upper shower plate and the lower shower plate are insulated from each other, and are gas-sealable and -separable from each other by mechanical movement of the second evacuatable chamber relative to the first evacuatable chamber.

18. The dual-chamber plasma processing apparatus according to claim 17, wherein in the first chamber, RF waves travel the first RIP matching circuit, a surface of the first shower plate, a space between the first shower plate and the second shower plate, a surface of the second shower plate, an inner surface of the first conductive chassis, and an inner surface of the enclosure for the first RF matching circuit in sequence.

19. The dual-chamber plasma processing apparatus according to claim 17, wherein in the second chamber, RF waves travel the second RF matching circuit, a surface of the support, a space between the second shower plate and the support, a surface of the second shower plate, an inner surface of the second conductive chassis, and an inner surface of the enclosure for the second RF matching circuit in sequence.

* * * * *

UNITED STATES PATENT AND TRADEMARK OFFICE
CERTIFICATE OF CORRECTION

PATENT NO. : 7,381,291 B2  Page 1 of 1
APPLICATION NO. : 10/901825
DATED : June 3, 2008
INVENTOR(S) : Yasuhiro Tobe et al.

It is certified that error appears in the above-identified patent and that said Letters Patent is hereby corrected as shown below:

Column 11, line 48; delete "111" and insert -- 11 --, therefor.

Column 14, line 16; In Claim 9, delete "werein" and insert -- wherein --, therefor.

Column 16, line 11; In Claim 17, delete "mechanical" and insert -- mechanically --, therefor.

Column 16, line 20; In Claim 18, delete "RIP" and insert -- RF --, therefor.

Signed and Sealed this

Fourth Day of November, 2008

JON W. DUDAS
*Director of the United States Patent and Trademark Office*